United States Patent
Boyd et al.

(10) Patent No.: US 10,340,658 B1
(45) Date of Patent: Jul. 2, 2019

(54) LASER SYSTEM FOR ATOMIC CLOCKS AND SENSORS

(71) Applicant: AOSense, Inc., Sunnyvale, CA (US)

(72) Inventors: Martin M. Boyd, Sunnyvale, CA (US); Brian R. Patton, San Francisco, CA (US)

(73) Assignee: AOSense, Inc., Sunnyvale, CA (US)

( * ) Notice: Subject to any disclaimer, the term of this patent is extended or adjusted under 35 U.S.C. 154(b) by 0 days.

(21) Appl. No.: 15/967,405

(22) Filed: Apr. 30, 2018

Related U.S. Application Data (60) Provisional application No. 62/492,874, filed on May 1, 2017, provisional application No. 62/492,872, filed
(Continued)

(51) Int. Cl.
*H01S 3/13* (2006.01)
*H01S 5/0687* (2006.01)
(Continued)

(52) U.S. Cl.
CPC .......... *H01S 5/0687* (2013.01); *H01S 3/0085* (2013.01); *H01S 3/08086* (2013.01); *H01S 3/10* (2013.01); *H01S 3/105* (2013.01); *H01S 3/10092* (2013.01); *H01S 3/13* (2013.01); *H01S 3/1305* (2013.01); *H01S 5/14* (2013.01); *H01S 5/142* (2013.01); *H01S 5/0085* (2013.01); *H01S 5/02284* (2013.01); *H01S 5/12* (2013.01); *H01S 5/125* (2013.01); *H01S 5/146* (2013.01); *H01S 5/4012* (2013.01)

(58) Field of Classification Search
CPC .. H01S 3/08086; H01S 3/105; H01S 3/10092; H01S 3/0085; H01S 3/10; H01S 3/1305; H01S 3/13; H01S 5/142; H01S 5/14; H01S 5/125; H01S 5/12; H01S 5/0085; H01S 5/0687; H01S 5/02284; H01S 5/146; H01S 5/4012
See application file for complete search history.

(56) References Cited

U.S. PATENT DOCUMENTS

6,178,036 B1 * 1/2001 Yao .................... H04B 10/2916
250/227.11
6,363,091 B1 * 3/2002 Zhu .......................... G04F 5/14
372/108
(Continued)

*Primary Examiner* — Kinam Park
(74) *Attorney, Agent, or Firm* — Van Pelt, Yi & James LLP (57) ABSTRACT

A laser system for atomic clocks and sensors includes a single laser, an intensity splitter, a modulator, and a feedback-based lock controller. The single laser outputs a central optical frequency of laser light that can be tuned. The intensity splitter splits the laser light along a first and a second optical path. A modulator is disposed in the first optical path. The portion of laser light from the first optical path is subjected to the modulator with the modulator disposed to generate a frequency-shifted sideband from some or all of the portion of the laser light subjected to the modulator, with the frequency-shifted sideband shifted by an adjustable frequency source, resulting in an adjustable frequency offset between the frequency-shifted sideband and an unmodulated carrier propagating in the second optical path. The feedback-based lock controller locks the optical frequency of the frequency-shifted sideband to a repumping transition for atom cooling.

22 Claims, 8 Drawing Sheets

Related U.S. Application Data on May 1, 2017, provisional application No. 62/492,876, filed on May 1, 2017.

(51) Int. Cl.
*H01S 3/105* (2006.01)
*H01S 3/08* (2006.01)
*H01S 5/14* (2006.01)
*H01S 3/10* (2006.01)
*H01S 3/00* (2006.01)
H01S 5/125 (2006.01)
H01S 5/12 (2006.01)
H01S 5/00 (2006.01)
H01S 5/40 (2006.01)
H01S 5/022 (2006.01)

(56) References Cited

U.S. PATENT DOCUMENTS

| | | | | |
|---|---|---|---|---|
| 2007/0009205 A1* | 1/2007 | Maleki | ............ | G02B 6/122 385/27 |
| 2010/0118375 A1* | 5/2010 | Maleki | ............ | G01R 29/0885 359/239 |
| 2012/0106579 A1* | 5/2012 | Roos | ............ | H01S 3/1305 372/20 |
| 2012/0194893 A1* | 8/2012 | Maleki | ............ | G02F 2/02 359/246 |
| 2015/0331109 A1* | 11/2015 | Christensen | ....... | G01B 9/02003 356/4.1 |

* cited by examiner

Laser source
Near F=2 -> F'=3

FIG. 2B

Lock sideband F=1 -> F'=2;
Carrier fully suppressed.

FIG. 2C

Carrier at arbitrary detuning;
Sideband on F=1 -> F'=2;
Independent intensity control

FIG. 2D

Sideband is at fixed frequency.
Carrier is steered by $v_{mod}$

LASER SYSTEM FOR ATOMIC CLOCKS AND SENSORS

CROSS REFERENCE TO OTHER APPLICATIONS

This application claims priority to U.S. Provisional Patent Application No. 62/492,874 entitled LASER SYSTEM FOR ATOMIC CLOCKS AND SENSORS filed May 1, 2017 which is incorporated herein by reference for all purposes. This application also claims priority to U.S. Provisional Patent Application No. 62/492,872 entitled ARCHITECTURE FOR COMPACT COLD ATOM CLOCKS filed May 1, 2017 which is incorporated herein by reference for all purposes. This application also claims priority to U.S. Provisional Patent Application No. 62/492,876 entitled INTEGRATED OPTICAL DETECTION FOR ATOMIC CLOCKS AND SENSORS filed May 1, 2017 which is incorporated herein by reference for all purposes.

This invention was made with Government support under Contract # D14PC00136 AND D15PC00053 awarded by DARPA. The Government has certain rights in the invention.

BACKGROUND OF THE INVENTION

Atomic clock stability and precision are fundamental to the performance of many applications including global positioning systems (GPS), advanced communications systems, and synthetic aperture radar. However, cost, complexity, clock size, and the state of current technology prevent advanced low-noise clocks from being used in these and many other applications. High-stability clocks can improve GPS performance and system integrity by reducing noise and extending the time duration between clock corrections. The use of portable high-performance clocks to distribute and decentralize precision timekeeping can help eliminate single point of failure weaknesses and ensure the integrity of communications and data storage transactions—even in GPS-denied environments. Advanced communication and synthetic aperture radar techniques can benefit from the low-phase-noise, low-drift microwave signals provided by atomic clocks. However, many of these applications are critically dependent on achieving high performance by maximizing signal-to-noise ratio (SNR) while minimizing size, weight, and power. Current atomic clocks contain multiple lasers and each laser contributes to the size, weight, and power requirements for the clock. In addition, multiple lasers provide potential points of failure and potential sources of instability for the system. A significant performance gap remains between atomic clocks developed in research laboratories and those that can be deployed into mobile environments.

BRIEF DESCRIPTION OF THE DRAWINGS

Various embodiments of the invention are disclosed in the following detailed description and the accompanying drawings.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A laser system for atomic clocks and sensors is disclosed. The laser system comprises a single laser, an intensity splitter, a modulator, and a feedback-based lock controller. The single laser outputs a central optical frequency of laser light that can be tuned. The intensity splitter splits the laser light along a first optical path and a second optical path. A modulator is disposed in the first optical path. The portion of laser light from the first optical path is subjected to the modulator with the modulator disposed to generate a frequency-shifted sideband from some or all of the portion of the laser light subjected to the modulator, with the frequency-shifted sideband shifted by an adjustable frequency source, resulting in an adjustable frequency offset between the frequency-shifted sideband and an unmodulated carrier propagating in the second optical path. The feedback-based lock controller locks the optical frequency of the frequency-shifted sideband to a repumping transition for atom cooling.

Using this architecture, a single source laser provides two optical frequencies for atom manipulation and detection. One of these frequencies is fixed to address an atomic repumping transition, while the other frequency can be tuned at will. The frequency that can be tuned at will is able to be changed in a rapid and agile manner and can be tuned near the cycling transition used for atom cooling and trapping. The light at the frequency that can be tuned at will does not need to be subjected to modulation, reducing potential sources of spectral instability in the cooling and trapping light. Additionally, this architecture allows independent adjustment of the power of each of these optical frequency components. Applications for the laser system include atomic clocks, sensors based on laser-cooled atoms, sensors based on thermal atomic or molecular beams, and/or sensors based on atomic vapor cells. The laser architecture has an important impact in being able to reduce the size, weight, and power (SWAP) of the complete system, which is a dominant consideration for deployment in practical applications.

Numerous applications can benefit from compact, high-stability atomic clocks. High-stability clocks could improve GPS performance and system integrity by reducing noise and extending the time duration between clock corrections. Use of portable high-performance clocks to distribute and decentralize precision timekeeping can help eliminate single point of failure weaknesses and ensure integrity of communications and data storage transactions, even in GPS-denied environments. Advanced communication and synthetic aperture radar techniques can benefit from the low-phase-noise, low-drift microwave signals provided by atomic clocks. Many of the above applications are critically dependent on achieving high performance by maximizing signal-to-noise ratio (SNR) while minimizing size, weight, and power (SWAP). A significant performance gap remains between atomic clocks developed in research laboratories and those that can be deployed into real world environments. With appropriate design choices, compact microwave frequency standards can bridge that gap, resulting in low-SWAP devices that improve performance by utilizing laser cooled atoms rather than thermal beams or vapor cells.

There are various types of atomic frequency standards, including vapor-cell atomic clocks, laser-cooled atomic clocks, thermal beam atomic clocks, and trapped ion clocks. In vapor-cell atomic clocks, the atomic ensemble is enclosed in a vapor cell (often with a buffer gas to inhibit collisions with the cell walls), and the kinetic temperature of the atoms is the same as that of the surrounding cell. In laser-cooled atomic clocks, optical beams are used to slow the atoms in one or more dimensions, such that the resulting kinetic distribution is described by a low temperature; in this case, buffer gases are generally omitted. Any element with transitions that are addressable by laser cooling techniques may be used for the atomic vapor, with typical choices including appropriate isotopes of either alkali atoms (cesium, rubidium, etc.) or alkaline earth atoms (strontium, calcium, etc.) or any other appropriate atoms. Frequency standards based on laser-cooled atoms tend to be free of many sources of inaccuracy and drift which affect vapor-cell atomic clocks—namely, drifts due to temperature and pressure variations within the buffer-gas cell. In both types of clock, it is usually desirable to enclose the atomic ensemble within a microwave cavity and/or magnetic shields, in order to provide homogeneous excitation of a microwave resonance or to shield the atoms from undesirable environmental perturbations. In both types of clock, optical state preparation yields a non-equilibrium population imbalance within the atomic sample prior to excitation of an atomic resonance; evolution of the atomic populations according to this resonance serves as the basis for a frequency (or equivalently, time) measurement.

Laser cooling and trapping of atoms relies upon momentum transfer from photons to atoms in order to provide a force which slows atoms in the laboratory frame. Large photon scattering rates are typically required in order to decelerate atoms over convenient distance scales. In the case of alkali atoms and other atoms with a hyperfine structure, the existence of multiple long-lived ground states frustrates the ability to scatter photons indefinitely, as atoms can decay from the excited state to a ground state which is not addressed by the cooling light. Once the atoms are in this "dark" state, they no longer interact with the optical beams and are not further cooled. A standard practice to avoid this situation is to use cooling light with multiple optical frequencies. The principal component is red-detuned from a strong optical transition that couples one ground state to an excited state (so that it is only resonant with atoms moving toward the beam, which see a blue-shifted beam due to the Doppler effect). The secondary component couples the nominally dark ground state to an excited state from which the atoms can decay into the other ground state. In this scenario, the first beam provides the "cooling" light, and the second beam acts as a "repump" that pumps the atoms from the dark ground state to the ground state more amenable for laser cooling. Typically, the repump light intensity is much lower than that of the cooling light. Once the atoms are cooled, they can be used as the time base for a frequency standard, for inertial sensing, for detection of magnetic or electric fields, and/or for other purposes. Many of these applications rely on optical detection of the atoms—for example, by detecting fluorescence or absorption of a low-intensity resonant optical beam at the end of the cycle. Additional atom manipulation and state preparation may be used within the cycle, in which case the atoms may be addressed by a laser with different optical detuning than the one(s) used for cooling and trapping. Since the repump light only serves to transfer the atoms out of the dark state, it does not generally require agile detuning. For these reason, devices based on laser-cooled atoms require a laser system that can provide two (or more) optical frequencies simultaneously, can change the optical frequency of at least one of these components in a deterministic fashion, and can adjust the intensity of each of these components within the sensor cycle.

Similar requirements apply to sensors based upon atomic beams and to vapor cells. In some cases (such as coherent population trapping), an optical beam with two coherent frequencies can be used to excite a coherence between/among ground-state sublevels—for example, for use as a microwave atomic clock. The laser architecture described here can be used for generation of light in this application and in other situations applying to atomic vapor cells and/or thermal atomic or molecular beams.

A typical method for generating cooling and repump light using a single laser is to send the entire laser output through an electro-optic phase modulator driven at frequency $f_{mod}$. This results in frequency modulation of the beam, creating optical sidebands at harmonics of $f_{mod}$. In some embodiments, the modulation waveform may be sinusoidal. In some embodiments, it is advantageous to use serrodyne modulation. Either the carrier or one of its sidebands can be independently locked to an atomic reference. The intensity of the optical sideband(s) can be tuned by changing the amplitude of the waveform driving the phase modulator. In this approach, both the cooling light and the repump light have passed through the modulator. While the above method can be used, it is not well-suited to compact, low-power atomic sensors. Commercially available electro-optic modulators with low drive power requirements are fabricated from lithium niobate ($LiNbO_3$), which suffers from photorefractive damage from intense near-infrared light. Oftentimes this necessitates attenuation of the cooling light and subsequent optical amplification after the modulator. Moreover, the above scheme does not offer independent control of the intensity of both optical frequency components. Variation of the modulator transfer function can also cause differential drift in the intensities of the resulting spectral components. The present disclosure addresses the shortcomings of prior laser architectures and allows a single laser to provide cooling light with minimal optical losses; it also produces repump light, allows agile frequency detuning of the cooling light, and permits independent control of the intensities of these two optical frequency components.

In some embodiments, the disclosed laser architecture is used to provide light to a laser-cooled $^{87}Rb$ microwave frequency standard. A distributed Bragg reflector (DBR) laser is coupled into an optical fiber (optionally after an optical isolator) and split into two paths. In various embodiments, a distributed feedback (DFB) laser, external-cavity diode laser (ECDL), frequency-doubled infrared laser, or any other appropriate laser is used instead. A small fraction of the laser output is directed to the "repump" optical path and sent through a fiber-coupled waveguide modulator (WGM) which provides phase modulation of the repump light. The majority of the source laser light is directed out the other port of the fiber-based splitter and is used for the cooling light; its phase remains unmodulated. For laser cooling of $^{87}Rb$ atoms, the laser optical frequency $\upsilon_{opt}$ is nominally tuned near the F=2→F'=3 cycling transition of $^{87}Rb$. The WGM is sinusoidally driven at a frequency $f_{RF}$>6568 MHz in most cases. Importantly, the voltage driving the WGM can be chosen to suppress the carrier optical frequency at the WGM output (i.e., by fine tuning of the modulation index). The optical spectrum at the WGM output thus contains no power at the original optical frequency component $\upsilon_{opt}$, and nonzero power at sidebands $\upsilon_{opt}\pm n \cdot f_{RF}$, where n is an integer. A secondary modulation at lower frequency $f_{lock}$ (~5 MHz) may also be injected into the WGM to provide a source of modulation to lock the laser to a saturated absorption spectroscopy feature. The output of the WGM is sent into another fiber-based optical splitter and the lower-intensity output directed to a lock module containing an evacuated Rb cell within a saturated absorption spectroscopy racetrack. The higher-frequency first-order sideband is locked to the F=1→F'=2 repump transition of $^{87}Rb$. Other atom-line-locking schemes—for example, modulation transfer, FM spectroscopy, dichroic atomic vapor laser locks, or polarization spectroscopy—could be used in place of saturated absorption spectroscopy. The majority of the light from the repump path is sent through a fiber-coupled microelectromechanical systems (MEMS) variable optical attenuator (VOA) for intensity control of the repump light. Since the optical sideband at $\upsilon_{opt}+f_{RF}$ is locked to the F=1→F'=2 repump transition, the carrier detuning from the F=2→F'=3 cycling transition is determined by $f_{RF}$. If $J_{RF}$=6568 MHz, the cooling light will be directly on resonance with the F=2→F'=3 transition; if $f_{RF}$=6568 MHz+Δf, the cooling light will be red-detuned from the F=2→F'=3 transition by an amount Δf. In some embodiments, the WGM drive frequency $J_{RF}$ is generated via direct digital synthesis (DDS) and a frequency-multiplying phase-locked loop (PLL), thereby allowing digital control of $f_{RF}$ and thus the optical carrier detuning. The speed with which the carrier detuning can be changed is determined by the DDS/PLL drive electronics, as well as the closed-loop bandwidth of the saturated absorption lock servo. Within the cooling path, the cooling light is also sent through a MEMS VOA. MEMS devices require much lower drive power (μW scale) than other optical switching technologies such as acousto-optic or electro-optic switches, although these various switching technologies may be used in the event other performance parameters are satisfied by these technologies. A fiber-based optical splitter/combiner is used to recombine the optical carrier and the repump light, resulting in an output optical spectrum that has one component locked to the repump transition and the majority of the laser intensity tuned near the F=2→F'=3 transition with user-selectable detuning. In some embodiments, the repump and cooling light is recombined as orthogonal polarizations in a polarization-maintaining fiber. The carrier intensity and repump intensity are independently tuned by the MEMS VOAs in the cooling and repump optical paths. An optional follow-up MEMS VOA or optical switch provides additional extinction of the light (>80 dB total) to prevent systematic errors of the Rb clock due to uncontrolled light-induced microwave resonance shifts (i.e., "AC" Stark shifts) caused by light leakage. Importantly, attenuation of either frequency component does not affect the light going to the Rb lock module. The laser system thus described is quite compact, occupying only ~40 mL in some embodiments.

In some embodiments, the frequency $f_{RF}$ is initially tuned to 6580 MHz, which sets the cooling light detuning to be 12 MHz red-detuned from the F=2→F'=3 cycling transition. All MEMS VOAs are set to be maximally transmitting, and the output of the laser system provides the light required for optical trapping of $^{87}Rb$ atoms within a magneto-optical trap (MOT) or optical molasses (OM). After a short (~20 ms) atom loading time, the DDS/PLL synthesizer chain ramps $J_{RF}$ to higher frequency, further detuning the cooling light in order to achieve polarization-gradient cooling; at the same time, the VOAs slowly attenuate the light until it is completely extinguished within the MOT or OM. Optical pumping of the atoms to the F=1 ground state can be achieved by setting $J_{RF}$=6835 MHz and turning on the cooling light VOA while blocking the repump light with the repump VOA; this excites the F=2→F'=2 transition, eventually forcing all atoms into the F=1 ground state. A Ramsey microwave interrogation sequence excites a ground-state hyperfine coherence, and the final atom populations in the F=1 and F=2 ground state are detected using absorption within an optical racetrack. In some embodiments, detection of fluorescence is used to measure these populations. The same laser architecture can be used for atom state detection by detuning $f_{RF}$ to 6568 MHz, placing the laser on resonance with the F=2→F'=3 transition, and attenuating the cooling beam with the VOA to generate a weak probe beam whose absorption within the atom trapping beam(s) indicates atom population. Toggling the repump VOA to be transmitting or non-transmitting determines whether only the F=2 atoms participate in the absorption measurement or whether all atoms absorb the detection light. After atom state detection, the clock sequence begins anew.

In some embodiments, the WGM is modulated with a drive amplitude which substantially suppresses the optical carrier from the WGM output (to >20 dB). This ensures that the saturated absorption spectrum produced within the lock module is effectively identical to the spectrum which would occur if the laser carrier frequency were directly tuned to the F=1 hyperfine ground state transitions. Any residual unsuppressed carrier light will contribute to an F=2 saturated absorption spectrum overlaid on the desired F=1 spectrum; the overlap will vary as $f_{RF}$ is changed. While this does not prevent agile detuning of the cooling light or generation of repump light, it does complicate the locking process and results in small systematic frequency shifts of the repump in concert with changes in carrier detuning. In order to confirm that the carrier is fully suppressed at the WGM output, the laser is tuned to the saturated absorption spectrum of $^{85}$Rb (either the F=2 or F=3 ground state). Since the ground-state hyperfine splitting of $^{85}$Rb is 3.0 GHz, there is no corresponding saturated absorption feature at an optical detuning 6.5 GHz away. The optimal WGM drive amplitude is the one which eliminates any saturated absorption feature when the nominal laser detuning addresses $^{85}$Rb. Complete carrier suppression also prevents optical interference of the carrier with itself along the two arms of the laser system. Because the WGM is modulated simultaneously at $f_{RF}$ and $f_{lock}$, any self-interference of the carrier is also modulated at $f_{lock}$. This lower-frequency modulation can be nulled in order to ensure complete carrier suppression by the WGM at all frequencies $f_{RF}$ via an additional active servo influencing the WGM drive amplitude.

This same laser architecture could be used to provide laser cooling and repump light to any cold-atom sensor, including sensors based on any alkali atom species. This laser architecture can be used to source light to a cold-atom inertial sensor (including accelerometers, gravimeters, gravity gradiometers, or gyroscopes) or a cold-atom frequency standard (including microwave and optical frequency standards). This laser architecture can also be used to generate dual-frequency light for state preparation, coherence generation, or detection within an atomic sensor or frequency standard based upon a vapor cell or a thermal beam of atoms or molecules.

The disclosed architecture represents an improvement over many other techniques used to provide cooling and repump light to a cold-atom sensor or frequency standard. While it is possible to use two offset-locked lasers to provide these two optical frequencies, a second spectroscopy-grade laser will in general require more input power (hundreds of mW) than the WGM used in this approach (tens of mW). A second laser also represents a larger risk of component failure than commercially available optical phase modulators. By sending the cooling light along a separate optical path and not through a modulator, this architecture makes maximum use of the available laser power and reduces the need for an optical amplifier. While in some cases it may be advantageous to amplify the output of this laser system, optical amplification of the combined cooling and repump frequencies can result in instabilities due to differential amplification efficiency of the two optical frequencies (e.g., resulting from etalon effects within the amplifier).

Direct modulation of the laser could potentially further simplify the design. While it is possible to demonstrate MOT operation using direct modulation of an 80 mW DBR laser to produce the repump sideband, there are difficulties with this approach when the laser frequency is tuned, or when the re-pump is switched on/off. Stable operational parameters are possible, but the settings often require updating as the DBR laser properties change with temperature and age over timescales of a few weeks.

In some embodiments, free-space optics are used instead of fiber-coupled optics. This may allow tighter integration and further miniaturization of the laser system, with the potential disadvantage of having to realign the system if any components need replacing. In contrast, all fiber-optic systems are typically assembled using fusion splicing.

In some embodiments, solid-state electro-optical switches and or variable optical attenuators (VOAs) with no moving parts may be used in place of MEMS switches and VOAs. Electro-optic methods typically result in faster switching times but require greater electrical power to operate.

In some embodiments, an optical amplifier such as a tapered amplifier or booster optical amplifier may be used to increase the power of the cooling light, the repump light, or the combined output of the laser system. Potential master lasers for this scheme include ECDLs, DBRs, DFBs, or frequency-doubled infrared lasers. The above lasers typically require precise temperature control for wavelength tuning, often accomplished via a thermo-electric cooler (TEC). Optical amplifiers may require cooling as well but operate over a much broader range of temperatures. In some embodiments, a single TEC is used to control the master laser and optical amplifier.

In some embodiments, a high frequency acousto-optic modulator (AOM) may be used to frequency shift light for the offset lock. However, WGMs normally have smaller size and greater modulation efficiency at high frequencies.

In some embodiments, some of the modulated light is split off from the offset lock and combined with the unmodulated output to provide repumping light—for example, for atom trapping and cooling. This can be done in free-space or with fiber-optics, using polarization sensitive or polarization insensitive optics. For example, a fiber-optic evanescent splitter/coupler can be used to combine light from two polarizations maintaining (PM) fibers. In some embodiments, a first input beam aligned to the slow axis of a first input fiber is coupled to the slow axis of an output fiber and a second input beam aligned to the slow axis of a second input fiber is coupled to the fast axis of the output fiber, delivering both beams along the single output fiber with orthogonal polarization and minimizing loss. In some embodiments, an evanescent splitter is used to combine light from two polarizations maintaining or polarizing input fibers along the same axis of a polarization maintaining or polarizing output fiber. In general, repumping polarization is not critical, and repumping power requirements are much lower than trapping and cooling cycling transition power requirements.

In some embodiments, the modulator is driven by a sinusoidal signal. In some embodiments, the amplitude of this drive signal results in a modulation index which completely suppresses the optical frequency content at the carrier frequency (i.e., the output optical frequency of the laser). In some embodiments, active control of the modulator drive amplitude is used to ensure complete carrier suppression. In some embodiments, detection of modulated optical interference between the cooling and repump paths is used to generate an error signal for active control of the modulator drive amplitude.

In some embodiments, a second modulator can be used in the repump path after the light is split off into the laser lock module. In this case, the "repump" light can separately be detuned by an arbitrary amount from the transition used in the lock module; this results in two optical frequencies at the system output which can both be detuned in an agile fashion.

In some embodiments, the laser lock is based on a vapor cell containing the same atomic species as the atoms used in the sensor being cooled/trapped/prepared by the laser system. In some embodiments, the laser lock is achieved with the same atoms being cooled/trapped/prepared by the laser system. In various embodiments, the laser lock is based on an optical cavity, a frequency comb, some other spectroscopic reference which has no direct spectral overlap with the atoms in the sensor, or any other appropriate reference.

In some embodiments, the disclosed laser system is used to drive two-photon transitions in the atoms within the sensor. In some embodiments, these transitions are two-photon Raman transitions, such as those employed in atom interferometry. In some embodiments, the laser system is used to generate a microwave coherence between atomic sublevels via coherent population trapping.

In some embodiments, the disclosed laser system is used to generate cooling/repump light for a frequency reference based upon microwave transitions between atomic states. In some embodiments, this laser system is used to generate cooling/repump light for a frequency reference based upon optical transitions between atomic states.

Figure 1:
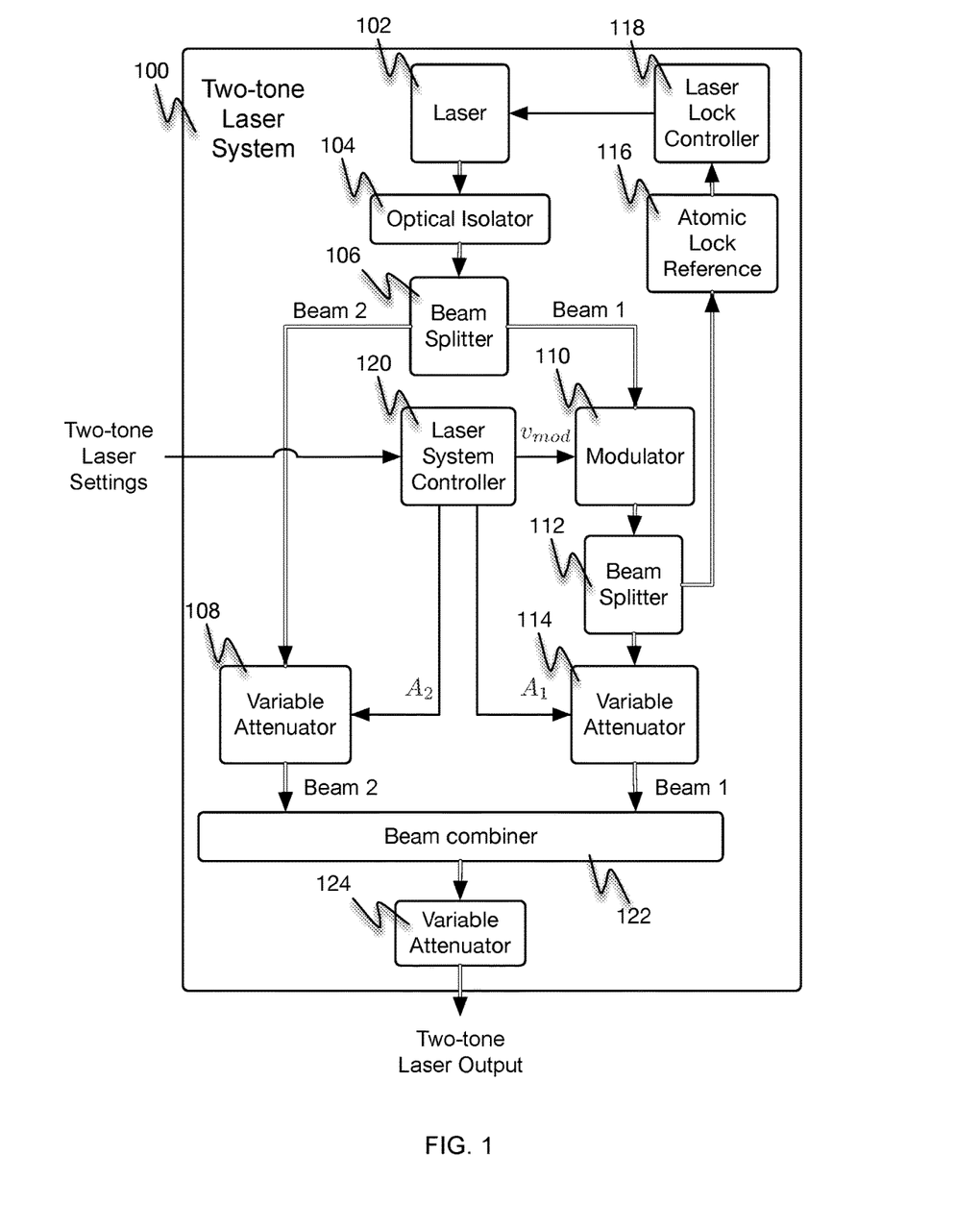
FIG. 1 is a block diagram illustrating an embodiment of an architecture for a laser system for atomic clocks and sensors.

FIG. 1 is a block diagram illustrating an embodiment of an architecture for a laser system for atomic clocks and sensors. In some embodiments two-tone laser system 100 is a free-space configuration. In some embodiments, two-tone laser system 100 is a fiber-coupled configuration. In the example shown, light beam from laser 102 passes through optical isolator 104 and is split via beam splitter 106 into beam 1 along a first optical path and beam 2 along a second optical path. For example, optical isolator 104 protects the output generated by laser 102 from back-reflection. Modulator 110 is disposed in the first optical path, where a frequency-shifted sideband is generated from some or all of the portion of the laser light subjected to the modulator. Modulated light out of modulator 110 is split via beam splitter 112 into a beam that propagates through variable attenuator 114 and a beam used for atomic lock reference 116. Atomic lock reference 116 interacts with light from beam splitter 112 and outputs a lock signal to laser lock controller 118, which steers the frequency of laser 102 to match that of the atomic reference. For example, frequency-shifted light from beam splitter 112 is used by atomic lock reference 116 to lock the laser to the $^{87}$Rb F=1→F'=2 repumping transition using any of several possible appropriate atomic physics spectroscopic techniques. Variable attenuator 114 outputs an attenuated light beam 1 controlled by amplitude control signal A1 from laser system controller 120 to beam combiner 122. Variable attenuator 108 is disposed in the second optical path and outputs an attenuated light beam 2 controlled by amplitude control signal A2 from laser system controller 120. Note that light beam 2 does not pass through any modulator so that it is unaffected by any active component that might distort the light beam characteristics (e.g., harmonic characteristics). Beam combiner 122 combines beam 1 from variable attenuator 114 and beam 2 from variable attenuator 108 and outputs combined beam to variable attenuator 124. For example, variable attenuator 124 controls the light intensity and allows switching off the light with high extinction ratio. Variable attenuator 124 outputs two-tone laser output.

In some embodiments, laser system controller 120 receives two-tone laser settings and sets the modulation frequency of modulator 110 and optical variable attenuator 108, optical variable attenuator 114, and optical variable attenuator 124. For example, two-tone laser settings are received from a resonance controller to implement a laser temporal control sequence for cooling and trapping atoms in a 3D optical cooling region, optical pumping, or atomic state detection.

Figure 2A:
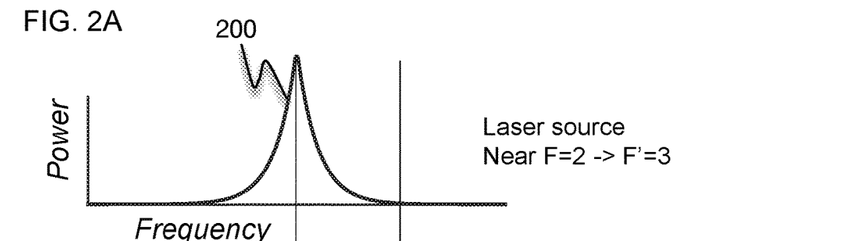
FIGS. 2A, 2B, 2C, and 2D are diagrams showing the conceptual optical power spectrum at different points in the optical path of two-tone laser.
Figure 2B:
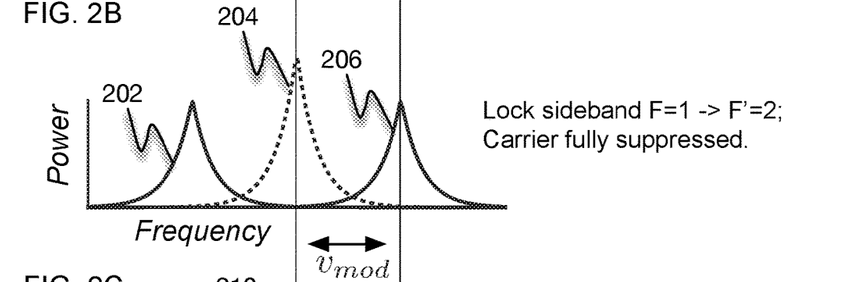
Figure 2C:
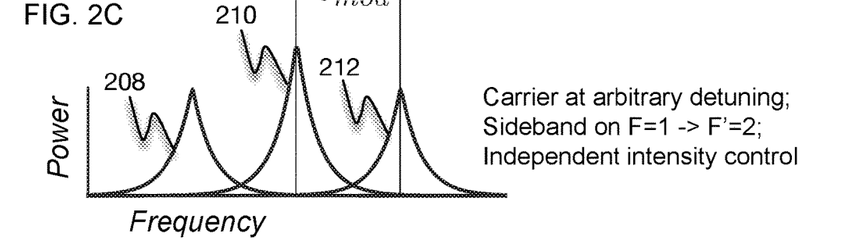
Figure 2D:
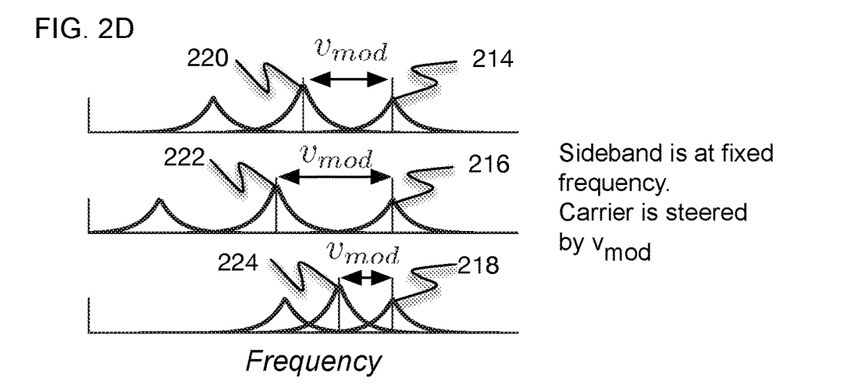

FIGS. 2A, 2B, 2C, and 2D are diagrams showing the conceptual optical power spectrum at different points in the optical path of two-tone laser. In some embodiments, the optical path is Beam 1 at the input of the variable attenuator of two-tone laser 100 of FIG. 1. In the examples shown in FIGS. 2A, 2B, 2C, and 2D, the horizontal axis shows optical frequency and the vertical axis indicates optical power. For example, curve 200 of FIG. 2A shows a laser source emitting one optical tone at a particular optical frequency. In some embodiments, the source laser is a distributed Bragg reflector (DBR) laser with a peak frequency near the F=2→F'=3 transition for rubidium (i.e., the peak of curve 200 is near the F=2→F'=3 transition for rubidium). FIG. 2B shows the optical power spectrum after a modulator. In the first optical path, a modulator phase-modulates the light at a frequency f=v_mod which results in the addition of two sidebands (e.g., curve 202 and curve 206) to the central carrier tone 204. The modulation amplitude is chosen to suppress the central carrier tone 204 so that all optical power is in these and higher-order sidebands. The sideband corresponding to curve 206 is used to lock the source laser to the repump transition F=1→F'=2 of Rb using an atomic lock reference; in other words, due to the locking, the sideband corresponding to curve 206 has an optical frequency that remains fixed for all time. FIG. 2C shows the optical power spectrum after a beam combiner. For example, the unmodulated carrier tone of the second optical path is recombined with the modulated sidebands from the first optical path resulting in all three tones (e.g., curve 208, curve 210, and curve 212) in the output. The sideband tone of curve 212 has a fixed frequency and the central tone of curve 210 is separated by 1*v_mod from the sideband tone of curve 212, and the sideband tone of curve 208 is separated by 2*v_mod from the sideband tone of curve 212. In some embodiments, the frequency v_mod is adjusted to place the central tone of curve 210 near the cooling or detection transitions. The sideband of curve 208 is far detuned and doesn't substantively interact with the atoms. FIG. 2D is a conceptual plot of the output from a two-tone laser system as the frequency setting v_mod of the two-tone laser settings is changed. As v_mod is changed, the upper sideband (e.g., curve 214, curve 216, and curve 218) remains at a fixed frequency because of the feedback to the source laser via an atomic lock reference and a laser lock controller. The central carrier frequency (e.g., curve 220, curve 222, and curve 224) is displaced by v_mod from the upper sideband frequency.

Figure 3:
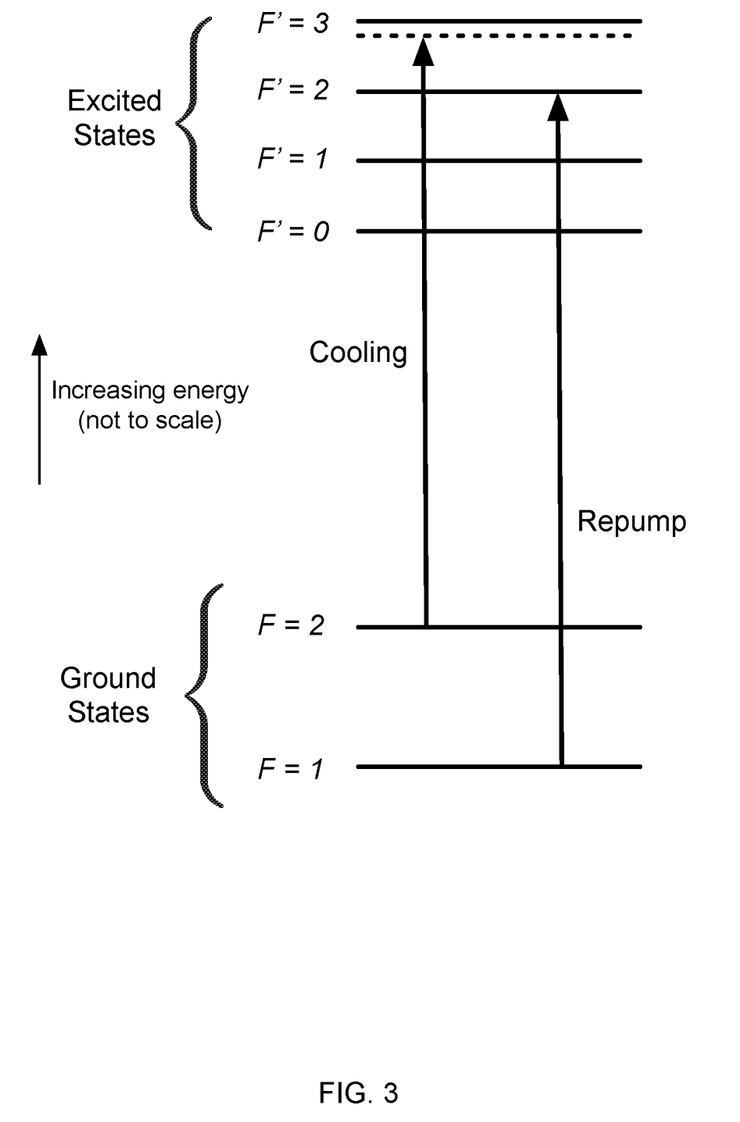
FIG. 3 is a diagram illustrating an embodiment of a conceptual energy-level diagram of energy levels.

FIG. 3 is a diagram illustrating an embodiment of a conceptual energy-level diagram of energy levels. In some embodiments, the energy levels are for $^{87}$Rb or an equivalent atom such as $^{39}$K or $^{41}$K with the same hyperfine structure. In the example shown, optical cooling and trapping requires cooling light which is red-detuned from a strongly absorbing transition. For example, the cooling beam (indicated by the arrow labeled 'Cooling') is detuned slightly lower in frequency than the F=2→F'=3 cycling transition, as shown by the dashed line. Atoms ending up in the F=1 ground state will remain without further interaction with the cooling beam. To prevent this, a separate repump beam (indicated by the arrow labeled 'Repump') is tuned to the F=1→F'=2 repump transition (or to the F=1→F'=1 transition), so that atoms excited by this beam have nonzero probability of returning to the F=2 ground state and experiencing further cooling.

Figure 4:
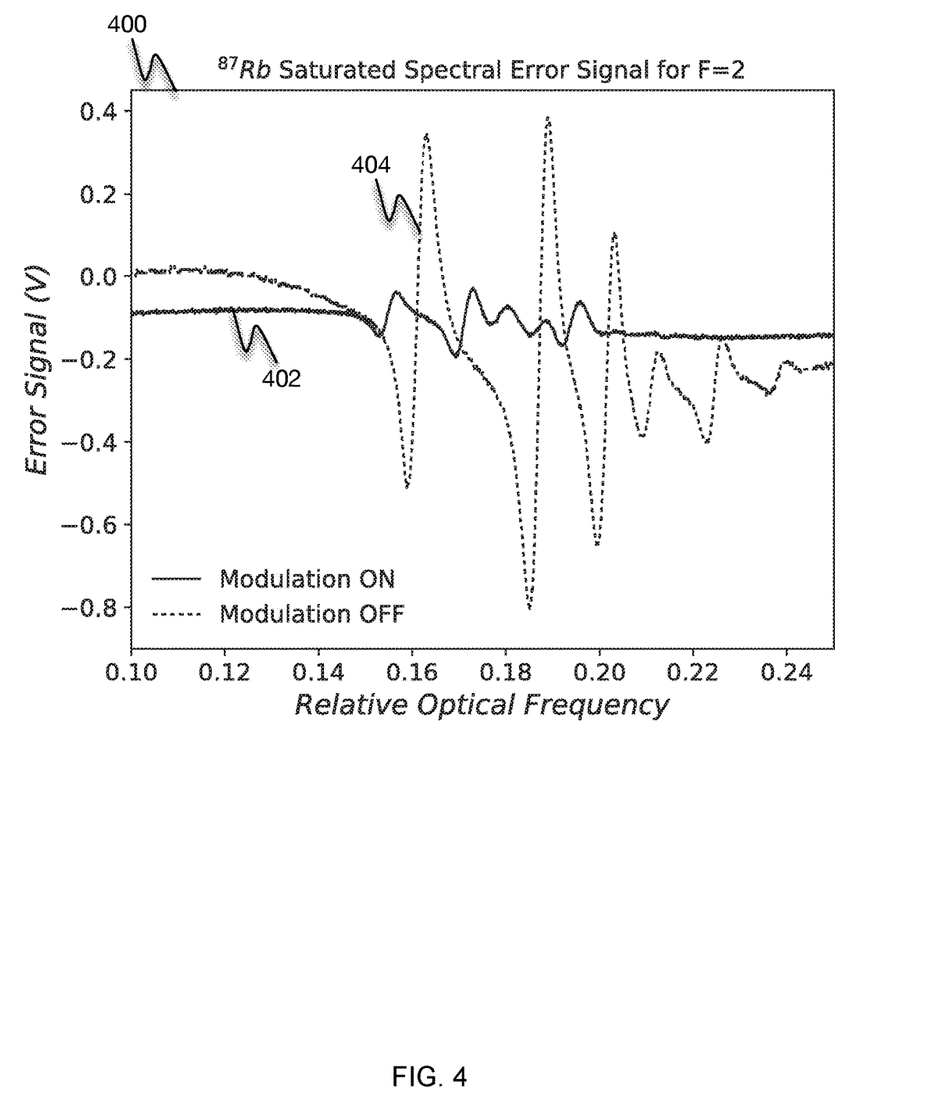
FIG. 4 is a graph illustrating an embodiment of a recording of demodulated saturated absorption spectroscopy signals from a Rb lock cell.

FIG. 4 is a graph illustrating an embodiment of a recording of demodulated saturated absorption spectroscopy signals from a Rb lock cell. In some embodiments, the graph of FIG. 4 corresponds to a measurement of atomic lock reference 116 of FIG. 1. In the example shown, the horizontal axis represents a sweep of laser optical frequency; the vertical axis shows the demodulated transmission of a weak laser beam traversing a small evacuated Rb cell in a racetrack-style saturated absorption spectroscopy setup. The dotted curve 404 (modulation off) shows the scanned saturated absorption spectrum of the F=2 ground-state transitions of $^{87}$Rb where the modulator is driven at a frequency $f_{lock}$ but not at $f_{RF}$. For example, when the modulation is off, the error signal is from the F=2 atoms. The solid curve 402 (modulation on) shows the scanned saturated absorption spectrum with the modulator driven at $f_{lock}$ and at $f_{RF}$=6568 MHz. For example, when the modulation is on and properly tuned in amplitude in order to suppress the carrier, the only interaction between the light and the atoms is due to the relevant sideband. The modulation frequency is chosen to be the difference in optical frequency between the cooling and repump transitions so that the sideband is swept through the F=1 transition as the overall laser carrier is swept through the F=2 transition. The resulting spectrum is identical to the spectrum which is obtained by tuning the laser to address the F=1 ground states without high-frequency modulation and demonstrates that the modulation frequency is chosen to ensure that the sideband is resonant with the F=1 repump transition when the carrier is tuned near the F=2 transition.

Figure 5:
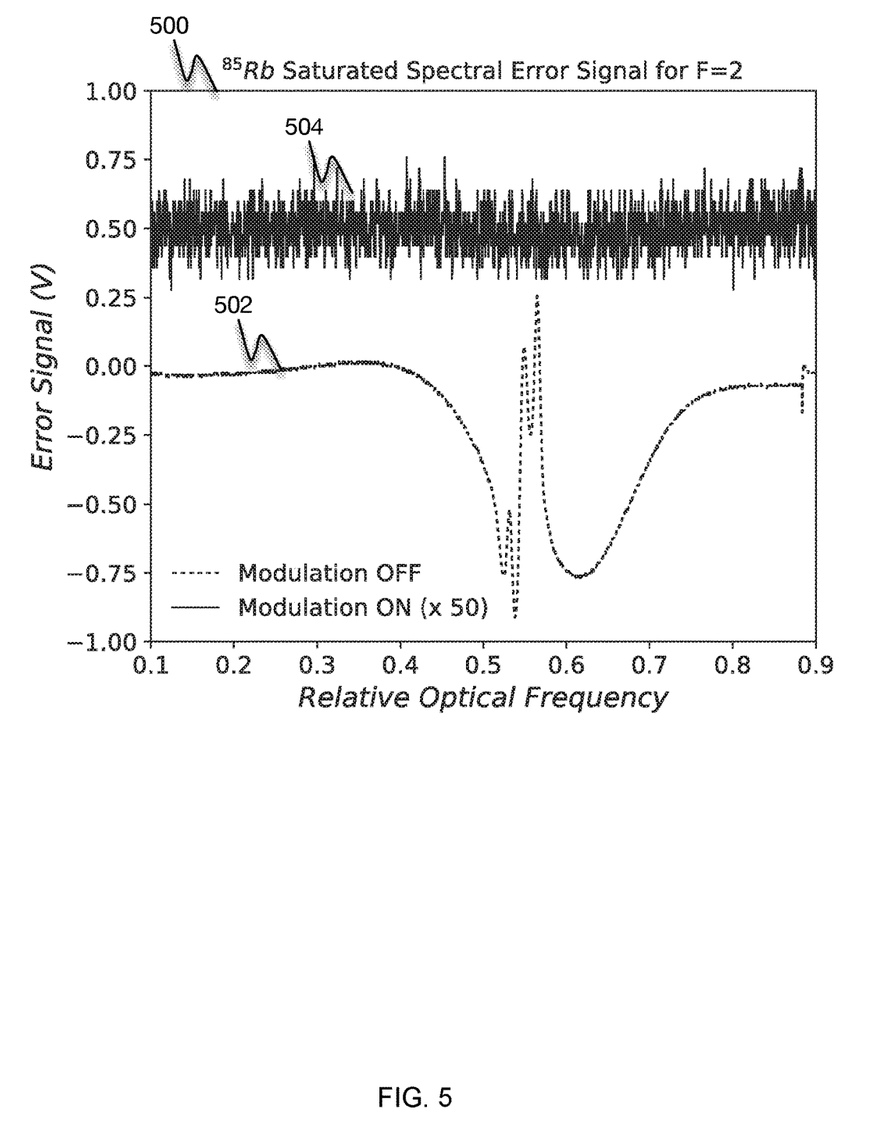
FIG. 5 is a graph illustrating an embodiment of a recording of demodulated saturated absorption spectroscopy signals from a Rb lock cell.

FIG. 5 is a graph illustrating an embodiment of a recording of demodulated saturated absorption spectroscopy signals from a Rb lock cell. In some embodiments, the graph of FIG. 5 corresponds to a measurement of atomic lock reference 116 of FIG. 1. In the example shown, the horizontal axis represents a sweep of laser optical frequency; the vertical axis shows the demodulated transmission of a weak laser beam traversing a small evacuated Rb cell in a racetrack-style saturated absorption spectroscopy setup. The dotted curve 502 (modulation off) shows the scanned saturated absorption spectrum of the F=2 ground-state transitions of $^{85}$Rb. For example, the modulator is driven at $f_{lock}$ but not at $f_{RF}$. The solid curve 504 (modulation on) shows the same scan with the WGM driven at $f_{lock}$ and at $f_{RF}$=6568 MHz. Curve 504 is shown magnified vertically 50x and displaced from the zero axis for clarity. Because $^{85}$Rb has no spectral feature at this detuning, no saturated absorption spectroscopy signal is seen in curve 504. This confirms that the modulator drive amplitude is tuned for complete carrier suppression.

Figure 6:
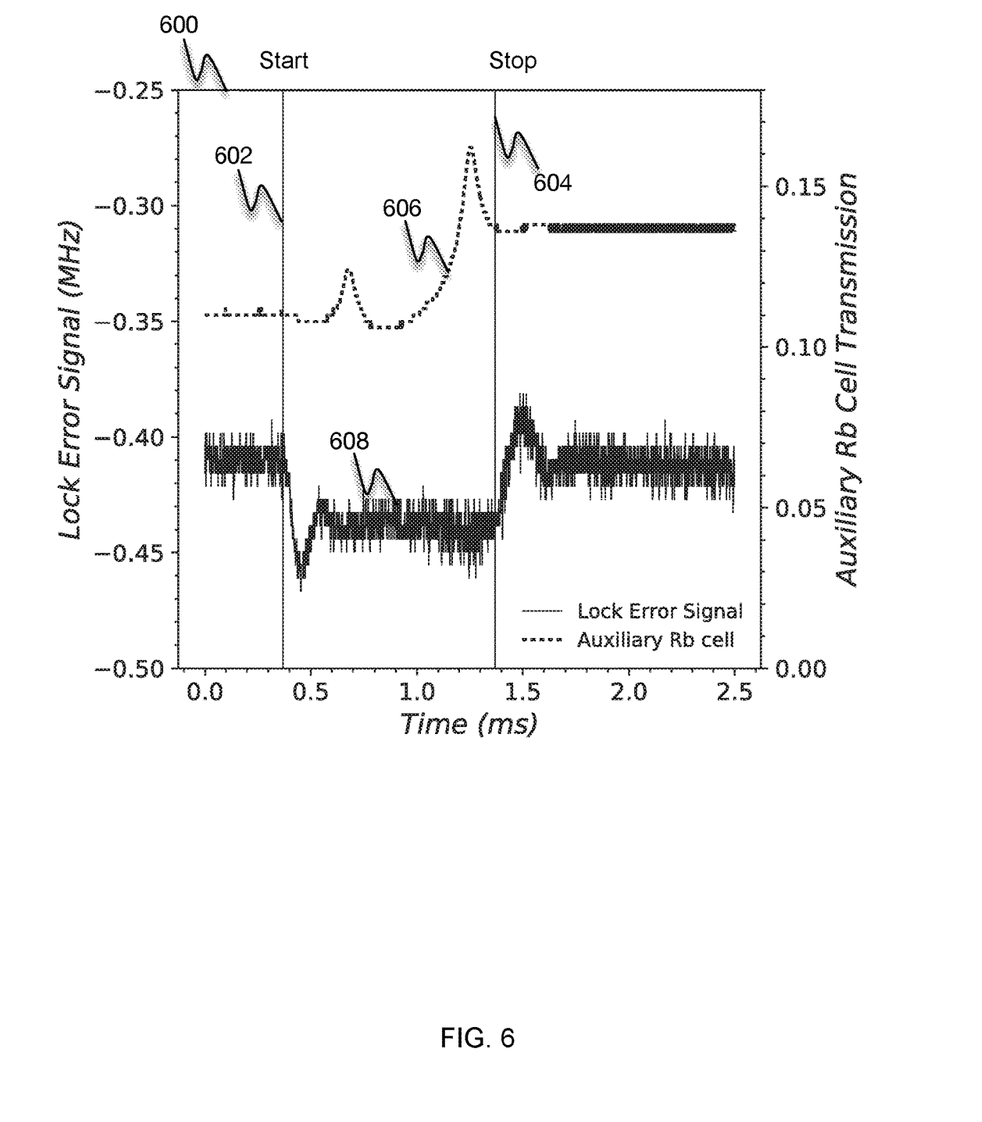
FIG. 6 is a graph illustrating an embodiment of a recording of transmission through a Rb cell.

FIG. 6 is a graph illustrating an embodiment of a recording of transmission through a Rb cell. In some embodiments, the graph of FIG. 6 corresponds to a measurement of atomic lock reference 116 of FIG. 1. In the example shown, the horizontal axis measures time. The left vertical axis depicts the error signal derived from the Rb saturated absorption spectroscopy lock (solid curve 608). The right vertical axis depicts the DC transmission of the laser carrier through a separate Rb-containing cell (dotted curve 606). For this measurement, the repump is completely attenuated in the output beam of the laser system, so that the beam going through the separate Rb cell has no repump component. At approximately 0.3 ms (line 602), the drive frequency $f_{RF}$ was changed by 230 MHz in a linear ramp spanning 1 ms. At the beginning of this sweep, the laser was on resonance with the F=2 ground state of $^{87}$Rb, as seen by the low transmission through the second Rb cell. As a result of the sweep of $f_{RF}$, the carrier sweeps through the Doppler-broadened absorption line, passing through two saturated absorption peaks as the detuning shifts. The lock error signal experiences only small excursions from its nominal set point during the process. This plot shows that rapid and deterministic detuning changes in the carrier can be achieved with this laser architecture.

Figure 7:
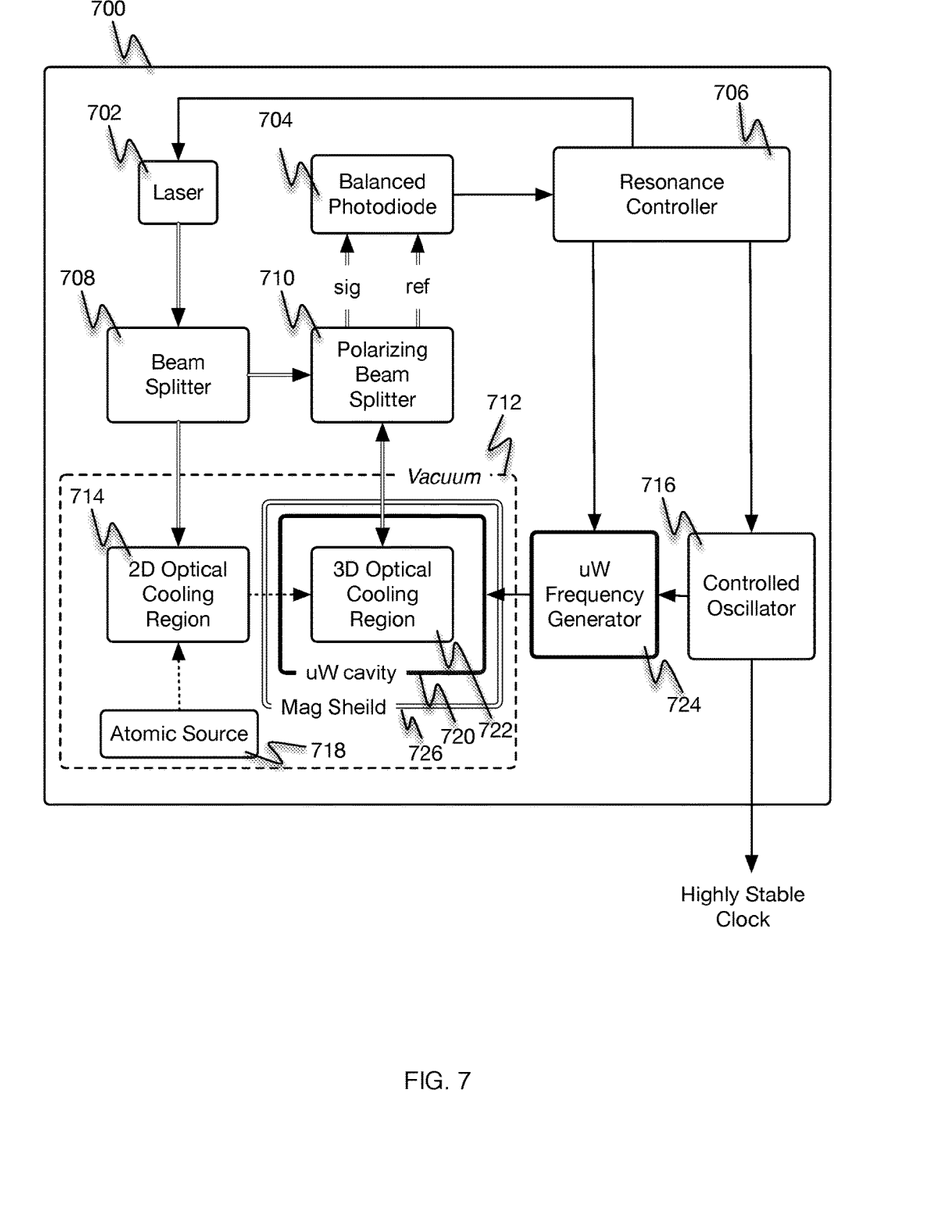
FIG. 7 is a block diagram illustrating the use of two tone laser system.

FIG. 7 is a block diagram illustrating the use of two tone laser system. In some embodiments, two-tone laser 100 of FIG. 1 is used to implement laser 702 of FIG. 7. In the example shown, system 700 comprises an architecture for a compact cold atom clock. Light beam from laser 702 is split via beam splitter 708 and polarizing beam splitter 710 to divert light to 2D optical cooling region (2D OCR) 714, 3D optical cooling region (3D OCR) 722, and balanced photodiode 704. Light returning from 3D OCR 722 has its polarization rotated 90° with respect to the inbound light and passes through polarizing beam splitter 710 again to be detected by balanced photodiode 704. Balanced photodiode 704 and associated electronics measure the signal while rejecting common mode noise between the signal and reference due to intensity variations. Components within dashed box 712 are maintained under high vacuum. For example, 2D OCR 714, 3D OCR 722, microwave cavity 720, and magnetic shield 726 surrounding microwave cavity 720 are all in vacuum, resulting in improved immunity to environmental perturbations such as temperature changes, dust, or acoustical noise.

In some embodiments, atomic source 718 produces atomic vapor for 2D OCR 714 using any element with transitions that are addressable by laser cooling techniques. For example, atomic source 718 uses appropriate isotopes of alkali atoms (cesium, rubidium, etc.) or alkaline earth atoms (strontium, calcium, etc.) or any other appropriate atoms. In some embodiments, $^{87}$Rb (rubidium) atoms are used as a source, and a microwave transition at 6.835 GHz is used for the atomic clock transition frequency. Resonance controller 706 receives input from balanced photodetector 704 and controls laser 702, microwave (uW) frequency generator 724, and controlled oscillator 716. For example, the absorption signal from balanced photodetector 704 contains information about the atomic state distribution in the atom cloud within 3D OCR 722. In turn, the atomic state distribution reflects the degree to which uW frequency generator 724 is in resonance with a transition frequency of the atom cloud and is used by the resonance controller to match the frequency of uW frequency generator 724 to the atomic state transition frequency. When resonance controller 706 determines that the frequency of uW frequency generator 724 is matched to the atomic state transition frequency, it synchronizes the frequency of controlled oscillator 716 to a fixed proportion of the frequency of uW frequency generator 724. In some embodiments, resonance controller 706 outputs a digital control signal for a digital to analog converter (DAC) which then outputs an analog voltage to control controlled oscillator 716. In some embodiments, controlled oscillator 716 is a voltage-controlled crystal oscillator (VCXO). In some embodiments, controlled oscillator 716 is digitally controlled and receives a digital control signal from resonance controller 706.

Figure 8:
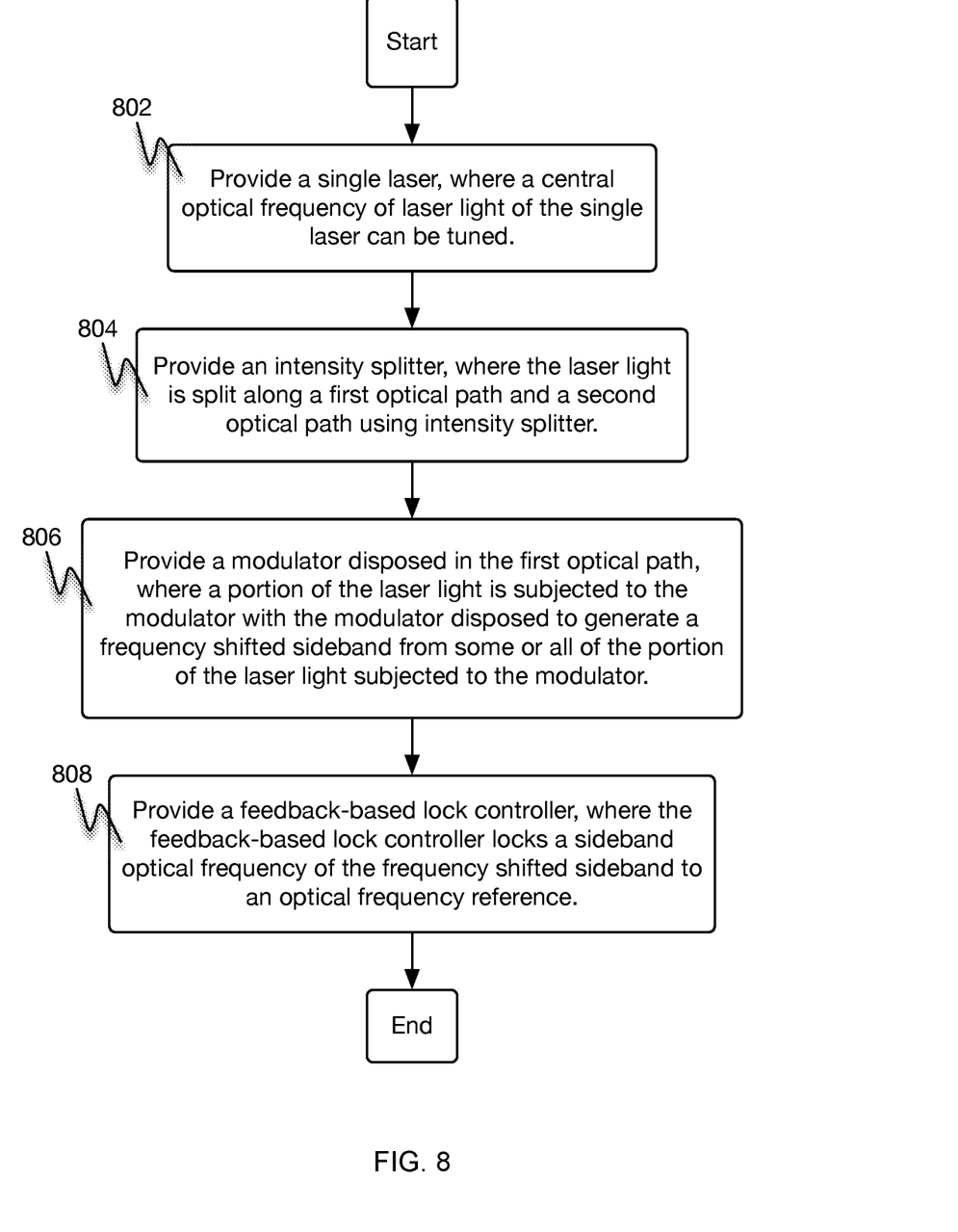
FIG. 8 is a flow diagram illustrating an embodiment of a process for laser system for atomic clocks and sensors.

FIG. 8 is a flow diagram illustrating an embodiment of a process for laser system for atomic clocks and sensors. In some embodiments, the process of FIG. 8 is executed using two tone laser system architecture 100 of FIG. 1. In the example shown, in 802, a single laser where a central optical frequency of laser light of the single laser can be tuned is provided. In 804, an intensity splitter where the laser light is split along a first optical path and a second optical path using intensity splitter is provided. In 806, a modulator disposed in the first optical path, where a portion of the laser light is subjected to the modulator with the modulator disposed to generate a frequency-shifted sideband from some or all of the portion of the laser light subjected to the modulator, with the frequency-shifted sideband shifted by an adjustable frequency source, resulting in an adjustable frequency offset between the frequency-shifted sideband and an unmodulated carrier propagating in the second optical path. In 808, a feedback-based lock controller, where the feedback-based lock controller locks the optical frequency of the frequency-shifted sideband to a repumping transition for atom cooling.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
   a single laser, wherein a central optical frequency of laser light of the single laser can be tuned;
   an intensity splitter, wherein the laser light is split along a first optical path and a second optical path using the intensity splitter;
   a modulator disposed in the first optical path, wherein a portion of the laser light is subjected to the modulator with the modulator disposed to generate a frequency-shifted sideband from some or all of the portion of the laser light subjected to the modulator, with the frequency-shifted sideband shifted by an adjustable frequency source, resulting in an adjustable frequency offset between the frequency-shifted sideband and an unmodulated carrier propagating in the second optical path, and
   a feedback-based lock controller, wherein the feedback-based lock controller locks the optical frequency of the frequency-shifted sideband to a repumping transition for atom cooling.

2. The system of claim 1, wherein a carrier frequency of the unmodulated carrier is near an atomic spectroscopic feature, so that a detuning of the carrier frequency from the atomic spectroscopic feature is determined by adjustment of the adjustable frequency source.

3. The system of claim 2, wherein the atomic spectroscopic feature near the carrier frequency is an atomic transition suitable for laser cooling.

4. The system of claim 1, further comprising a combiner to combine a repumping portion of the frequency shifted sideband for repumping atoms and the carrier frequency.

5. The system of claim 4, wherein the combiner combines the frequency shifted sideband and the carrier frequency with orthogonal polarization.

6. The system of claim 1, wherein an amplitude of modulation generating the frequency shifted sideband is chosen to substantially suppress the carrier frequency in the first beam path.

7. The system of claim 6, wherein an active servo is used to ensure substantial carrier suppression in the first beam path.

8. The system of claim 1, further comprising an optical amplifier.

9. The system of claim 1, wherein the modulator comprises an electro-optic modulator (EOM).

10. The system of claim 9, wherein the electro-optic modulator comprises a waveguide modulator (WGM).

11. The system of claim 1, wherein the modulator comprises an acousto-optic modulator (AOM).

12. The system of claim 1, wherein the portion of the laser light subjected to the modulator is less than 50%.

13. The system of claim 1, wherein the single laser comprises an external cavity diode laser.

14. The system of claim 1, wherein the single laser comprises a distributed feedback or distributed Bragg reflector laser.

15. The system of claim 1, wherein the laser light predominantly travels through fiber and fiber-coupled components.

16. The system of claim 1, wherein the laser light predominantly travels through free space is and free-space components.

17. The system of claim 1, further comprising one or more electronically controlled attenuators or switches for variable intensity control of the carrier frequency and/or the frequency shifted sideband.

18. The system of claim 17, wherein the one or more electronically controlled attenuators or switches comprise fiber-coupled microelectromechanical system (MEMS) devices.

19. The system of claim 17, wherein the one or more electronically controlled attenuators or switches comprise free-space MEMS devices.

20. The laser system of 17, wherein the one or more electronically controlled attenuators or switches comprise solid-state electro-optic devices with no moving parts.

21. The system of claim 2, wherein the laser light along the second optical path is subsequently subjected to a second modulator before being recombined with the laser light of the first optical path after the modulator which has been modulated to generate the frequency shifted sideband locked to the repumping transition.

22. A method, comprising:
   providing a single laser, wherein a central optical frequency of laser light of the single laser can be tuned;
   providing an intensity splitter, wherein the laser light is split along a first optical path and a second optical path using the intensity splitter;
   providing a modulator disposed in the first optical path, wherein a portion of the laser light is subjected to the modulator with the modulator disposed to generate a frequency-shifted sideband from some or all of the portion of the laser light subjected to the modulator, with the frequency-shifted sideband shifted by an adjustable frequency source, resulting in an adjustable to frequency offset between the frequency-shifted sideband and an unmodulated carrier propagating in the second optical path, and
   providing a feedback-based lock controller, wherein the feedback-based lock controller locks the optical frequency of the frequency-shifted sideband to a repumping transition for atom cooling.

* * * * *